United States Patent
Hsieh

(12) 
(10) Patent No.: US 6,334,750 B1
(45) Date of Patent: Jan. 1, 2002

(54) FASTENER FOR A HEAT-RADIATOR ON A CHIP

(76) Inventor: Hsin-Mao Hsieh, No. 6, East Section, Chiao Nan Li, Industrial 6th Rd., Pingtung City, Pingtung Hsien (TW)

(*) Notice: Subject to any disclaimer, the term of this patent is extended or adjusted under 35 U.S.C. 154(b) by 0 days.

(21) Appl. No.: 09/618,345

(22) Filed: Jul. 18, 2000

(51) Int. Cl.[7] .......................... F16B 13/00; F16B 19/00
(52) U.S. Cl. .......................... 411/508; 24/453; 24/458; 174/16.3; 165/80.3; 411/343
(58) Field of Search .................. 411/343, 508, 411/509, 510; 24/453, 457, 458; 361/704; 165/80.3; 174/16.3; 257/718

(56) References Cited

U.S. PATENT DOCUMENTS 2,769,363 A * 11/1956 Kight .......................... 411/343
6,112,378 A * 9/2000 Lee .............................. 24/458

* cited by examiner

Primary Examiner—Neill Wilson

(57) ABSTRACT

A fastener for a heat-radiator on a chip is disclosed. The fastener has a leg. A cone-shaped foot of which a maximum diameter is larger than that of the leg is formed at a first end of the leg. A head is formed at a second end of the leg. Two bow arms are oppositely formed at two sides of the leg each with a first end fixed on a bottom face of the head. A ring is formed on second ends of the bow arms with an opening for the rod to extend therethrough.

2 Claims, 8 Drawing Sheets

FASTENER FOR A HEAT-RADIATOR ON A CHIP

BACKGROUND OF THE INVENTION

1. Field of the Invention

The present invention is related to a fastener, and more particularly to a fastener used for installing a heat-radiator on a chip of a computer.

2. Description of Related Art

Referring to FIGS. 7 and 8, a heat-radiator (20) to lower the temperature of an operating chip (30) is generally mounted by fasteners on a main board (40) where the chip (30) is installed. A conventional fastener (5) has a leg (50). A cone-shaped foot (51) of which a maximum diameter is larger than that of the leg (50) is formed at a first end of the leg (50). A channel (52) is defined at a joint of the leg (50) and the foot (51). The channel (52) enables the foot (51) to be compressed, whereafter the foot (51) is narrow enough to be inserted through apertures. A neck (53) is formed at a second end of the leg (50) and a head (54) is formed on a distal end of the neck (53). Two bow arms (55) are oppositely provided at two sides of the neck (53) and each has a fixed end adjacent the head (54) and a free end adjacent the leg (50).

The heat-radiator (20) has a plurality of first apertures (21) respectively aligned with a plurality of second apertures (41) defined in the main board (40). When a user uses the fastener (5) to assemble the heat-radiator (20) on the main board (40), the foot (51) is compressed to pass through one of the first apertures (21) and the respective second aperture (41), and afterwards recovers to its original size whereby the fastener (5) is secured between the apertures (21, 41). At the same time, the bow arms (55) are compressed to push against a top surface of the heat-radiator (20). Thus, the heat-radiator (20) is fastened on the main board (40).

However, the fastening effect of the conventional fastener is not satisfactory because the bow arms (55) each have only a small contact area with the top surface of the heat-radiator (20) and the fastener (5) does not effectively fasten. Furthermore, a heat radiator fitted with a cooling fan may suffer from vibrations coming from the fan during operation as the fastener (5) does not have a significant damping effect.

Therefore, it is an objective of the invention to provide an improved fastener to mitigate and/or obviate the aforementioned problems.

SUMMARY OF THE INVENTION

The main objective of the present invention is to provide a fastener which can securely fasten a heat-radiator to lower the temperature of an operating chip on a main board where the chip is installed.

Other objects, advantages and novel features of the invention will become more apparent from the following detailed description when taken in conjunction with the accompanying drawings.

DETAILED DESCRIPTION OF THE PREFERRED EMBODIMENT

Figure 1:
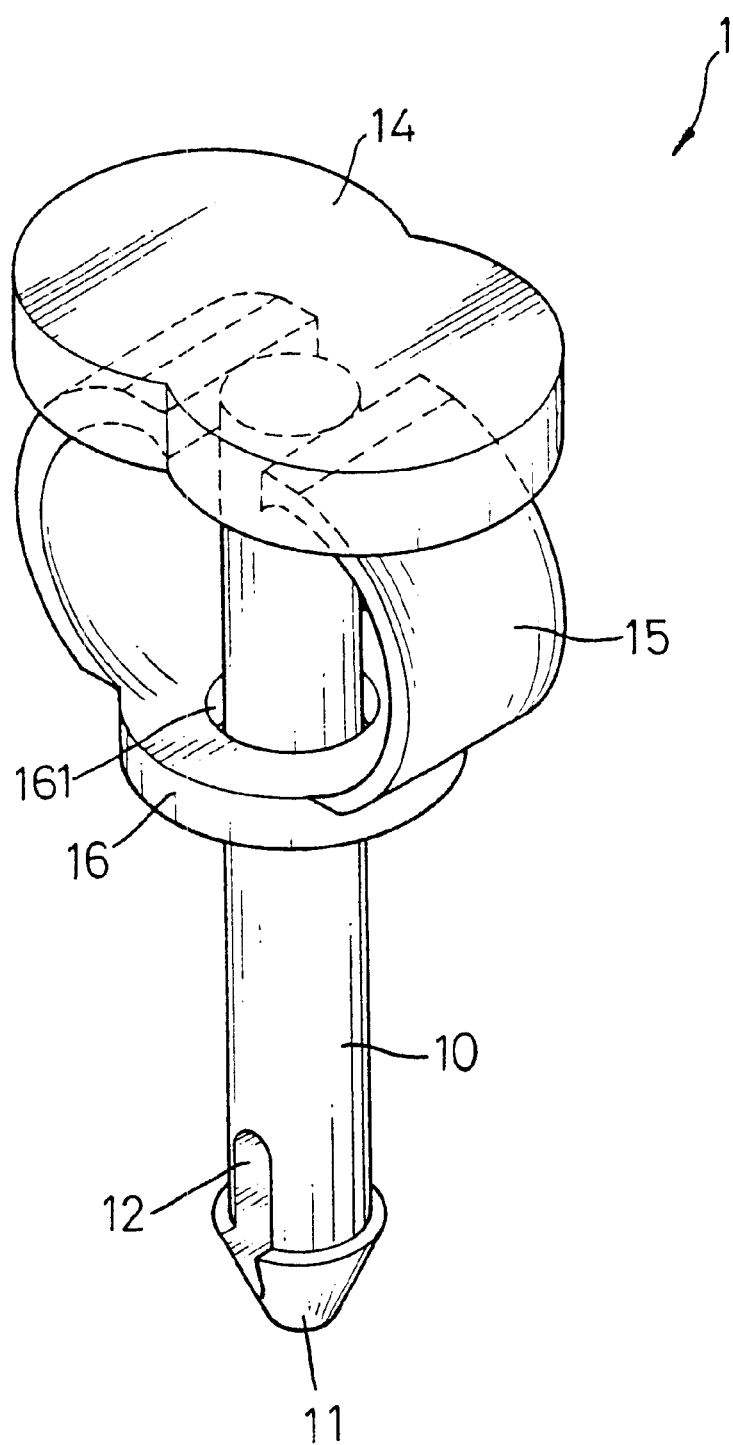
FIG. 1 is a perspective view of a fastener in accordance with the invention.

Referring to FIG. 1, a fastener (1) in accordance with the present invention comprises a leg (10), a foot (11), a head (14), a ring (16) and two flexible bow arms (15). The leg (10) includes an upper end and a lower end. The foot (11) is a cone with a large end adjoining the lower end of the leg (10) and a small distal end. The large and small ends respectively have a diameter larger and smaller than a diameter of the leg (10). A channel (12) transversely extends between the lower end of the leg (10) and large end of the foot (11). Although in this embodiment the channel (12) is transverse, it is to be appreciated that other configurations are practical. The channel (12) gives the foot (11) and the lower end of the leg (10) resiliency whereby they can be deformed to a smaller size than normal. The head (14) is formed on the upper end of the leg (10). The ring (16) defines a bore (162) with a diameter larger than the diameter of the leg (10) and can travel substantially between the head (14) and a central point between the upper and lower ends of the leg (10). The two flexible bow arms (15) are oppositely formed on two sides of the leg (10) each with a first end fixed on a bottom face of the head (14) and a second end fixed on a periphery of the ring (16).

Figure 2:
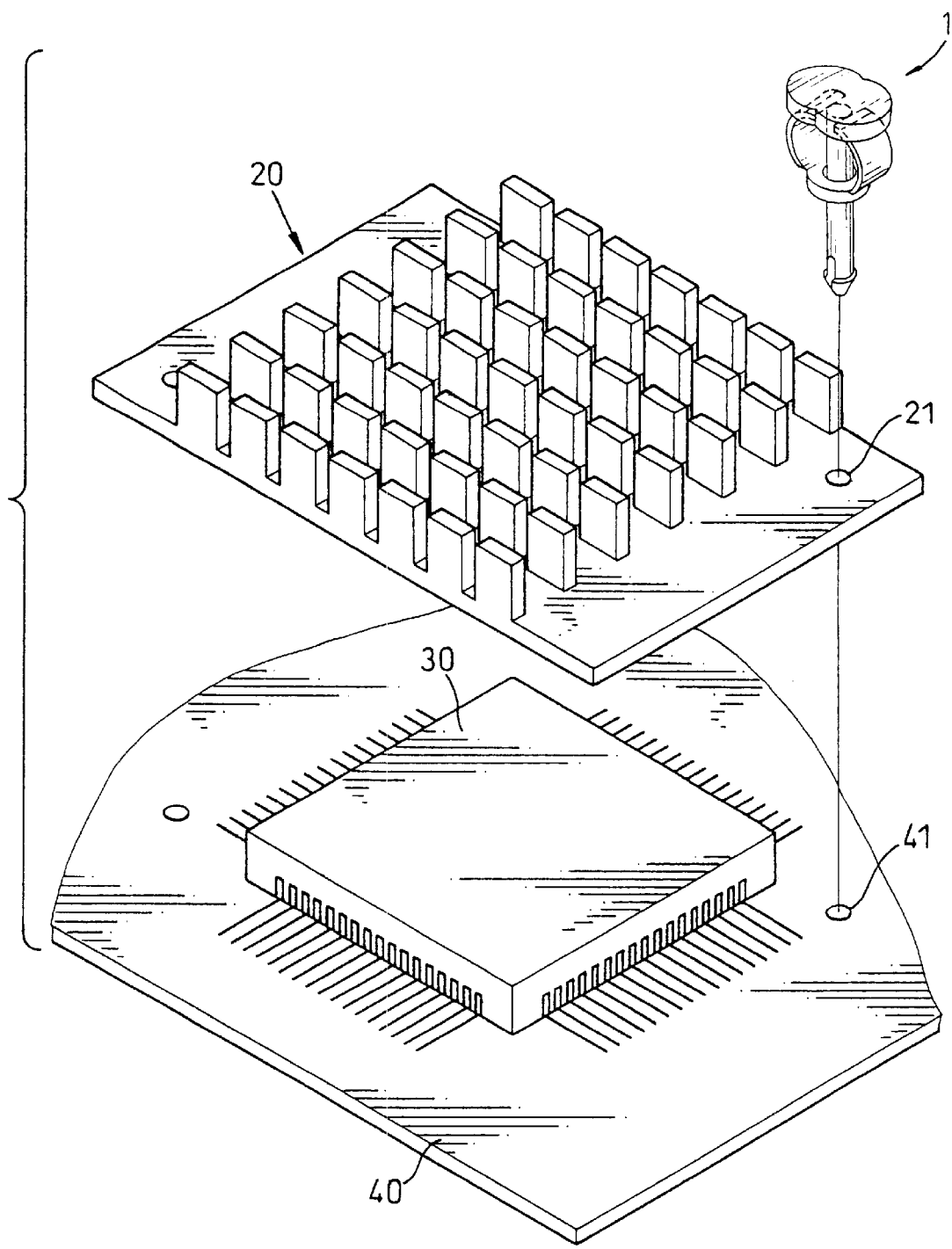
FIG. 2 is a perspective view showing the fastener to fasten a heat-radiator on a chip.
Figure 3:
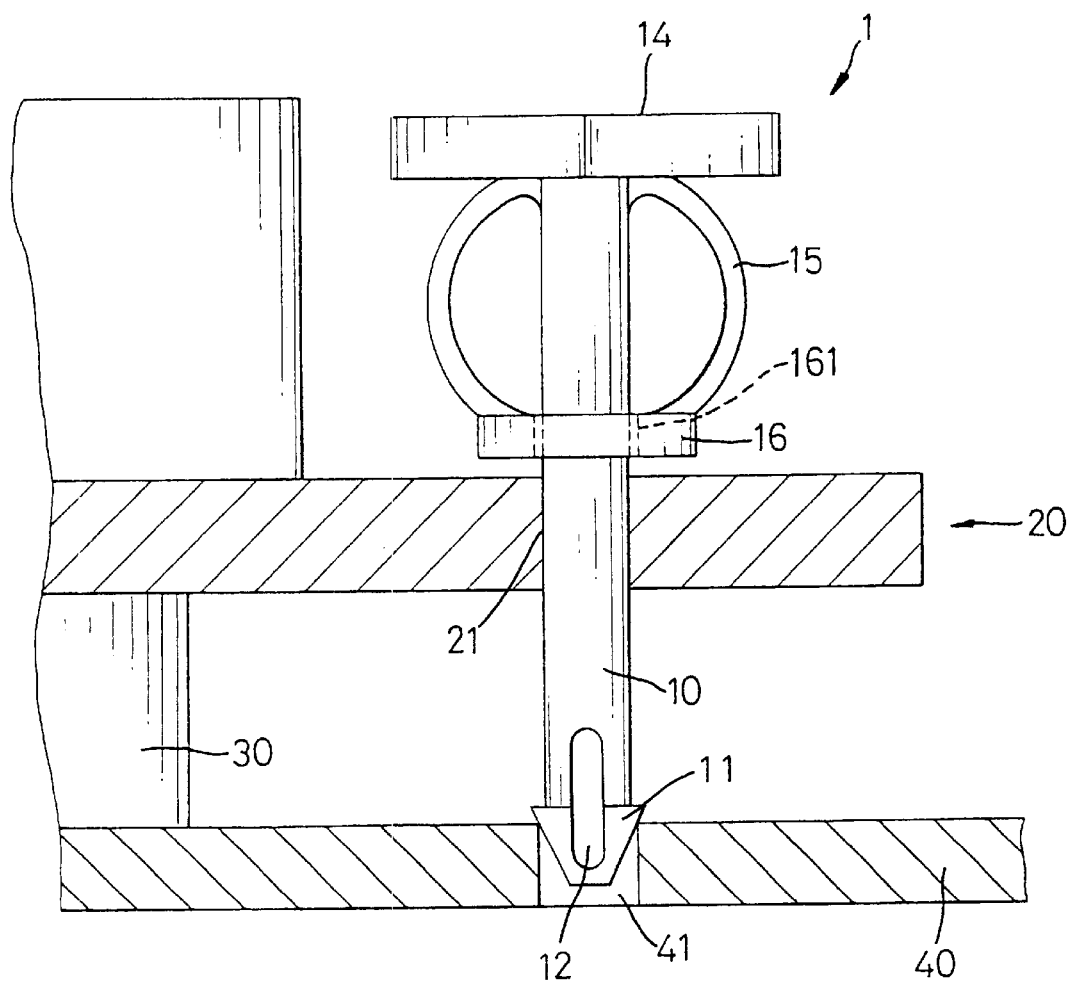
FIG. 3 is a side sectional view showing the fastener being inserted in the heat-radiator and a main board.

Referring to FIGS. 2 and 3, a heat-radiator (20) is mounted on a chip (30) installed on a main board (40). The heat-radiator (20) has first apertures (21) in alignment with second apertures (41) defined in the main board (40). Although in practice each matched pair of first and second apertures (21, 41) receives therethrough a corresponding one of the fasteners (1), reference hereinafter is in the singular. A distance between a top face of the heat-radiator (20) and a bottom face of the main board (40) is greater than a distance between the central point of the leg (10) and the large end of the foot (11).

Figure 4:
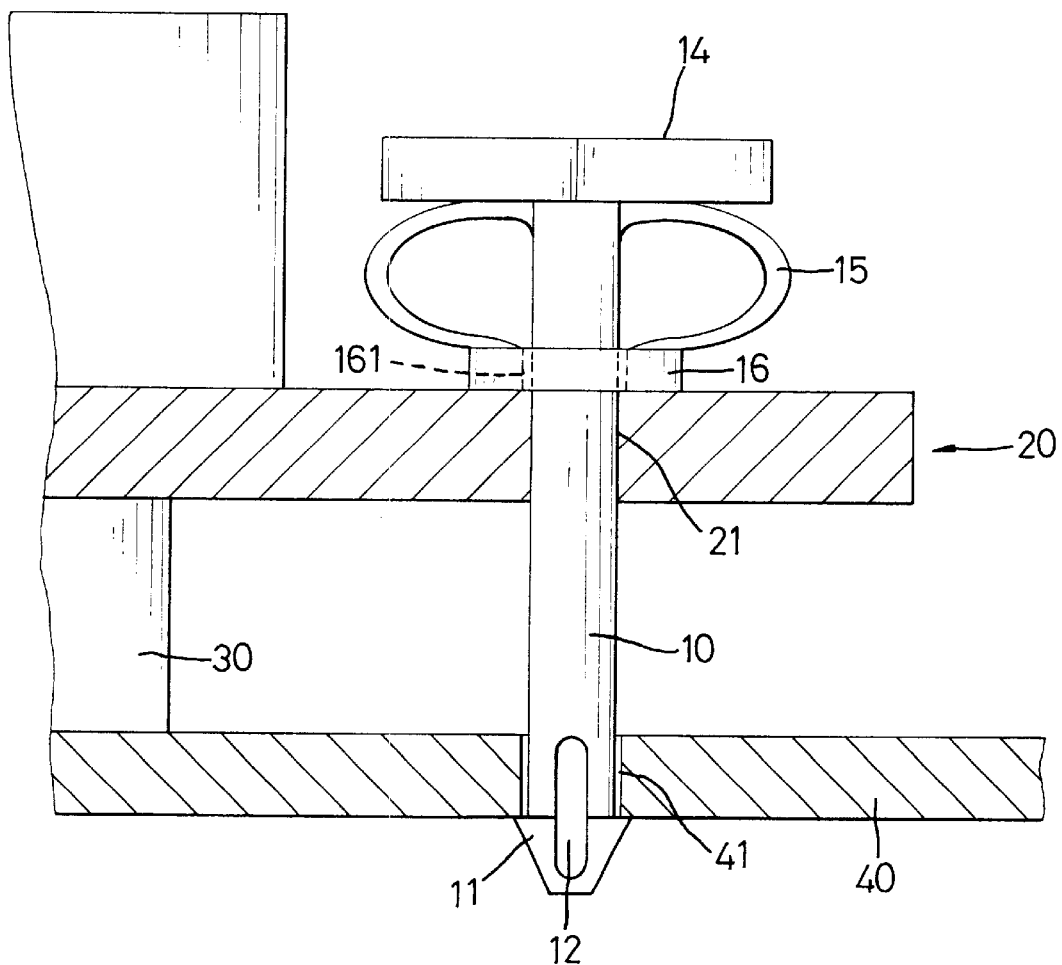
FIG. 4 is a side sectional view showing the fastener having been inserted in the heat-radiator and a main board.

Referring to FIGS. 3 and 4, to engage the heat radiator (20) with the main board (40) and sandwich the chip (30) therebetween, the foot (11) and the lower end of the leg (10) are compressed to become small enough to pass through the apertures (21, 41), and then they recover to their original sizes whereby the fastener (1) will not be unintentionally released from the apertures (21, 41). At the same time, the ring (16) is pushed by the heat-radiator (20) towards the head (14) to compress the bow arms (15) whereby resiliency of the bow arms (15) urges the ring (16) back against a top surface of the heat-radiator (20), as well as pulling up the foot (11) against the bottom face of the main board. Because a bottom face of the ring (16) fully contacts the heat-radiator (20) and there is a large contact area, the heat-radiator (20) is tightly mounted on the main board (40) by the fastener (1) without any possibility of loosening. Furthermore, the large contact area can help to eliminate vibrations of a cooling fan installed on the main board (40) during operation.

Figure 5:
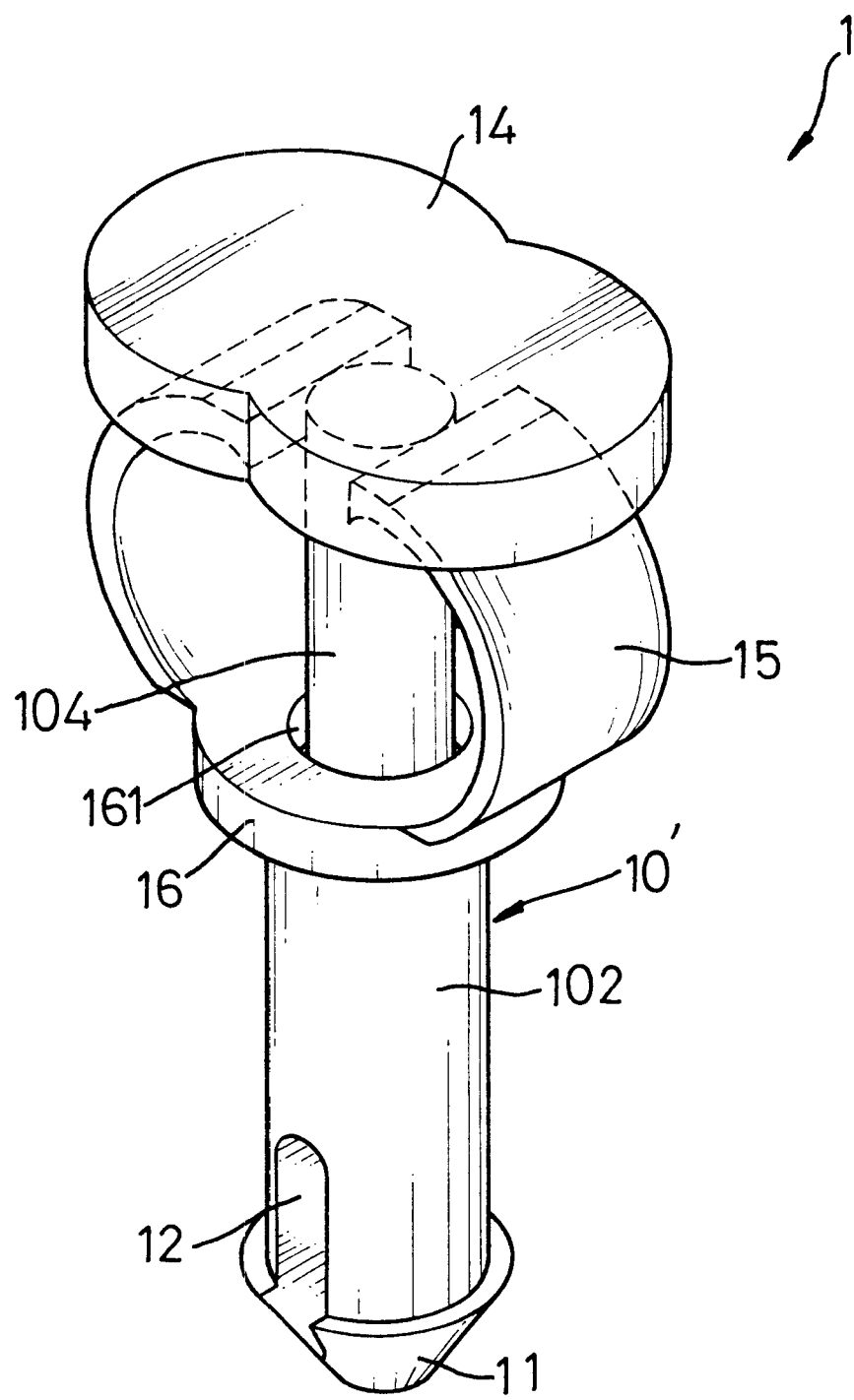
FIG. 5 is a perspective view of a second embodiment of the fastener of FIG. 1.
Figure 6:
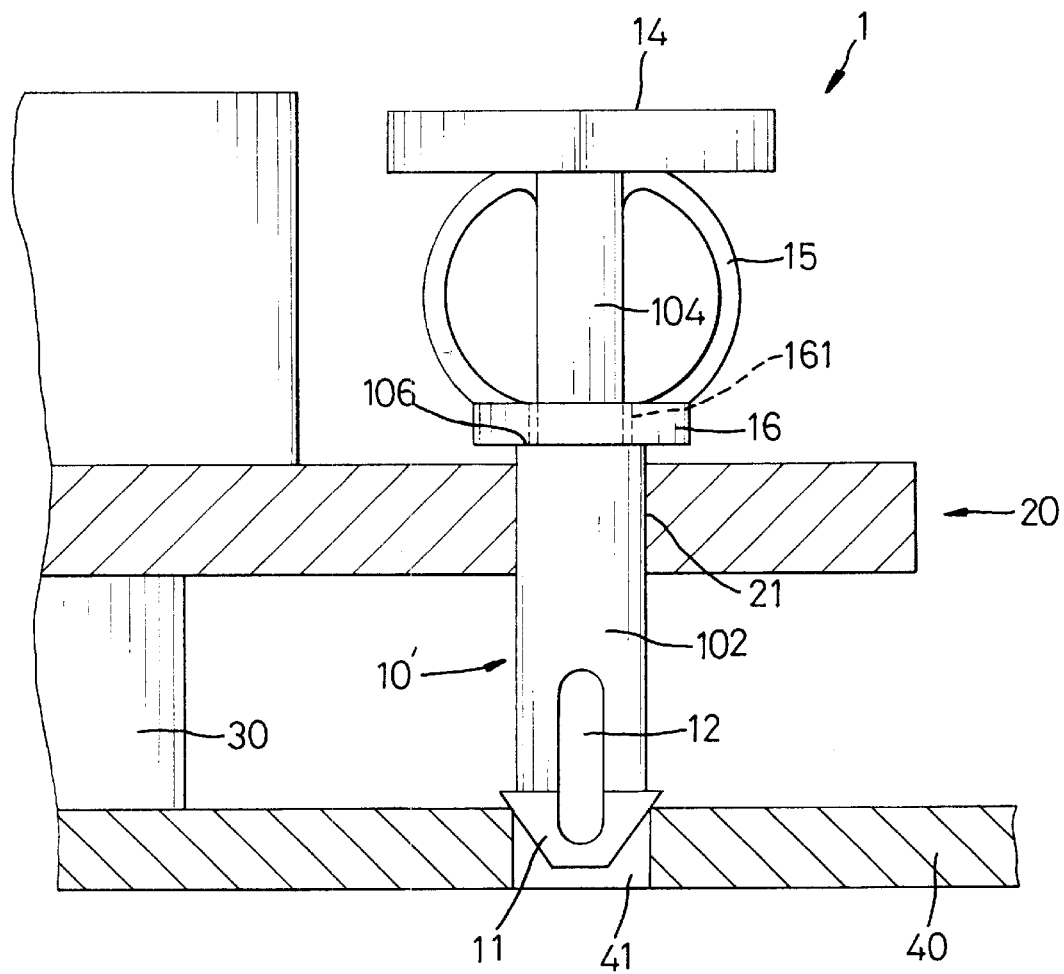
FIG. 6 is a side sectional view showing the fastener of the second embodiment being inserted in the heat radiator and the main board.
Figure 7:
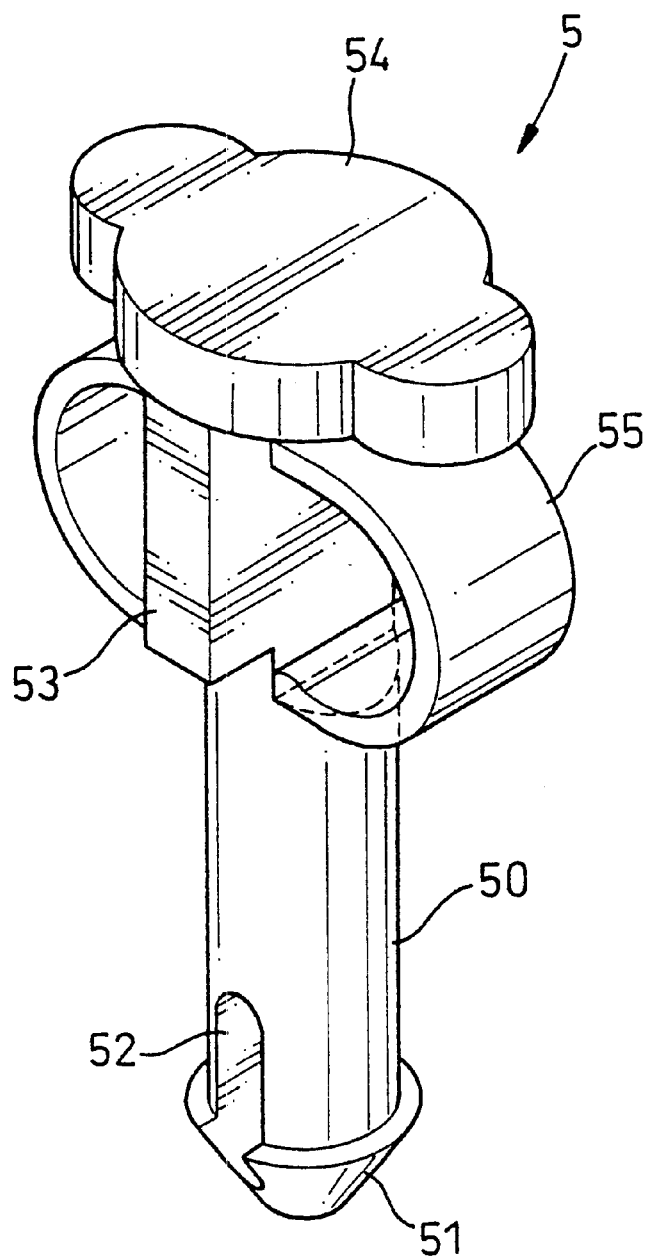
FIG. 7 is a perspective view of a conventional fastener.
Figure 8:
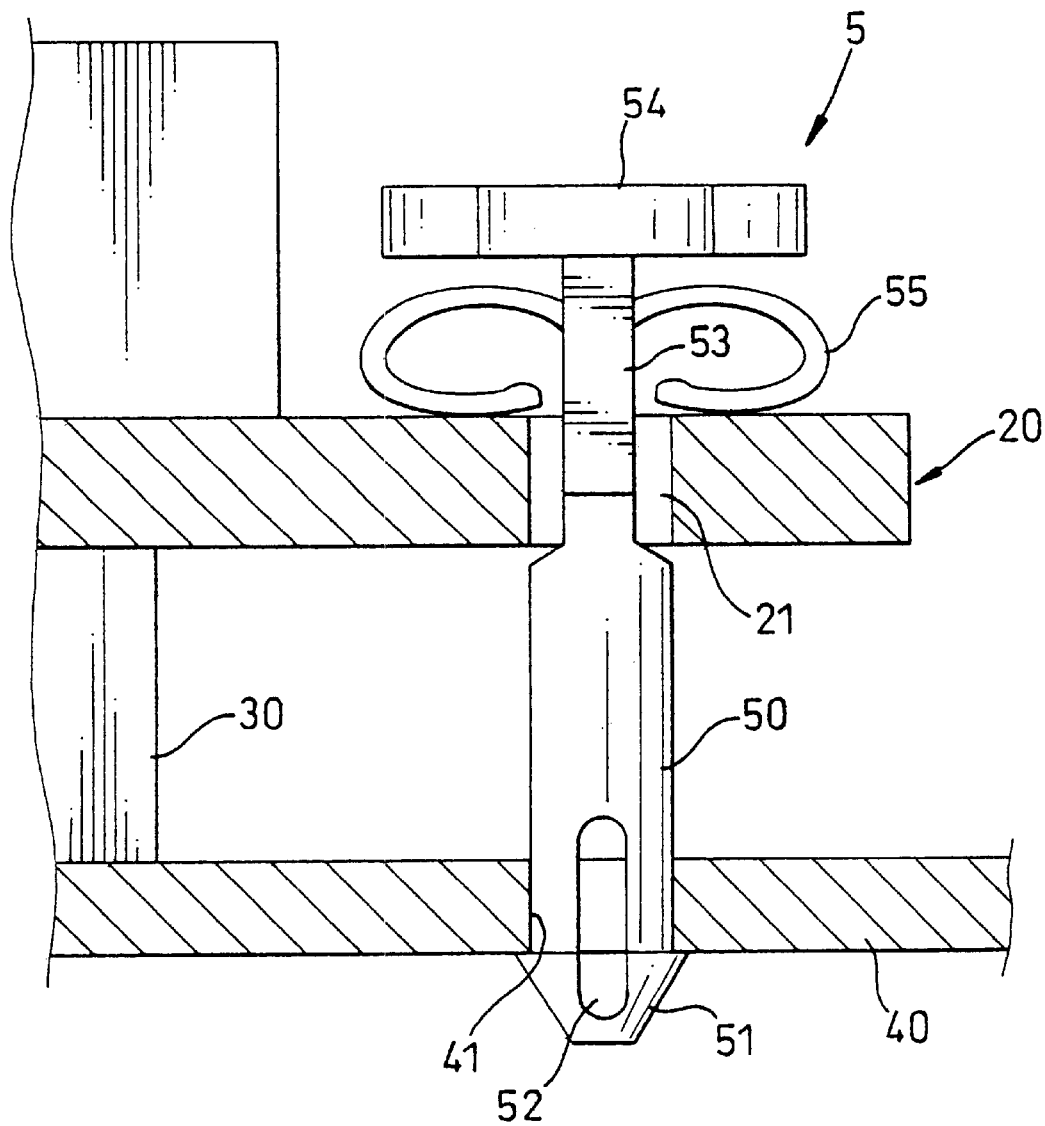
FIG. 8 is a side sectional view showing the conventional fastener fastening the heat-radiator on a main board.

A second embodiment of the fastener (1) in accordance with the present invention is shown in FIGS. 5 and 6. In the second embodiment, the leg (10') is formed with a lower portion (102) with a large diameter, an upper portion (104) with a small diameter, and a shoulder (106) formed between the upper and lower portions (102, 104). The large diameter of the lower portion (102) is smaller than the large end of the foot (11). The bore (161) of the ring (16) has a diameter bigger than the small diameter of the upper portion (104) but smaller than the large diameter of the lower portion (102), whereby the ring (16) can only travel along the upper portion of the leg (10'). Otherwise, the second embodiment is the same as the first embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for a heat-radiator on a chip, the fastener comprising:

a leg (10') having a lower portion (102) with a large diameter, an upper portion (104) with a small diameter, and a shoulder (106) formed between said lower portion (102) and said upper portion (104);

a cone-shaped foot (11) of which a maximum diameter is larger than that of said lower portion (102) of said leg (10) formed at a first end of said leg (10);

a head (14) formed on said upper portion (104) of said leg (10');

two flexible bow arms (15) oppositely formed at two sides of said upper portion (104) each with a first end fixed on a bottom face of said head (14); and a ring (16) formed on second ends of said bow arms (15) with a bore (161) for said upper portion (104) of said leg (10') being inserted therethrough.

2. The fastener as claimed in claim 1, wherein said bore (161) has a diameter smaller than that of said lower portion (102) but larger than that of said upper portion (104).

* * * * *